(12) United States Patent
Pritchard et al.

(10) Patent No.: US 11,675,329 B2
(45) Date of Patent: Jun. 13, 2023

(54) FUNCTIONAL SAFETY SYSTEM USING THREE DIMENSIONAL SENSING AND DYNAMIC DIGITAL TWIN

(71) Applicant: Rockwell Automation Technologies, Inc., Mayfield Heights, OH (US)

(72) Inventors: John Pritchard, Mayfield Heights, OH (US); Michael Sarvo, Jr., Mayfield Heights, OH (US); Samuel Owen, Mayfield Heights, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 41 days.

(21) Appl. No.: 17/352,920

(22) Filed: Jun. 21, 2021

(65) Prior Publication Data
US 2022/0404794 A1 Dec. 22, 2022

(51) Int. Cl.
*G05B 19/406* (2006.01)
*G06F 9/455* (2018.01)
(Continued)

(52) U.S. Cl.
CPC ....... *G05B 19/406* (2013.01); *G05B 19/4155* (2013.01); *G06F 9/45508* (2013.01);
(Continued)

(58) Field of Classification Search
CPC ............. G05B 19/406; G05B 19/4155; G05B 2219/24024; G05B 2219/31368;
(Continued)

(56) References Cited

U.S. PATENT DOCUMENTS

2021/0049779 A1* 2/2021 Harviainen ............ H04N 19/54
2022/0088787 A1* 3/2022 Vu ........................... G06T 17/10
2022/0250244 A1* 8/2022 Song ......................... G06T 7/73

FOREIGN PATENT DOCUMENTS

WO 2018/14818 A1 8/2018

OTHER PUBLICATIONS

Matteo Melchiorre, "Collison Avoidance using Point Cloud Data Fusion from Multiple Depth Sensors: a Practical Approach", Dec. 2019, IEEE, Internet Retrieval URL:<https://ieeexplore.ieee.org/stamp/stamp.jsp?tp=&arnumber=8932143> (Year: 2019).*
(Continued)

*Primary Examiner* — Kenneth M Lo
*Assistant Examiner* — Jonathan Michael Skrzycki
(74) *Attorney, Agent, or Firm* — Amin, Turocy & Watson, LLP

(57) ABSTRACT

A functional safety system performs safety analysis on three-dimensional point cloud data measured by a time-of-flight (TOF) sensor that monitors a hazardous industrial area that includes an automation system. To reduce the amount of point cloud data to be analyzed for hazardous conditions, the safety system executes a real-time emulation of the automation system using a digital twin and live controller data read from an industrial controller that monitors and controls the automation system. The safety system generates simulated, or shadow, point cloud data based on the emulation and subtracts this simulate point cloud data from the measured point cloud data received from the TOF sensor. This removes portions of the point cloud data corresponding to known or expected elements within the monitored area. Any remaining entities detected in the reduced point cloud data can be further analyzed for safety concerns.

20 Claims, 14 Drawing Sheets

(51) Int. Cl.
*G06F 16/215* (2019.01)
*G05B 19/4155* (2006.01)
*G06F 30/10* (2020.01)

(52) U.S. Cl.
CPC .. *G06F 16/215* (2019.01); *G05B 2219/24024* (2013.01); *G05B 2219/31368* (2013.01); *G05B 2219/50193* (2013.01); *G06F 30/10* (2020.01)

(58) Field of Classification Search
CPC ....... G05B 2219/50193; G06F 9/45508; G06F 16/215; G06F 30/10
See application file for complete search history.

(56) References Cited

OTHER PUBLICATIONS

Extended European Search Report received for European Patent Application Serial No. 22180203.6 dated Oct. 26, 2022, 8 pages.

* cited by examiner

US 11,675,329 B2

FUNCTIONAL SAFETY SYSTEM USING THREE DIMENSIONAL SENSING AND DYNAMIC DIGITAL TWIN

BACKGROUND

The subject matter disclosed herein relates generally to industrial safety systems, and, in particular, to optical safety monitoring.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a functional safety system is provided, comprising a controller interface component configured to read controller data from an industrial controller that monitors and controls an industrial automation system; a digital twin execution component configured to execute an emulation of the industrial automation system based on the controller data and a digital twin of the industrial automation system, and to generate shadow point cloud data for the industrial automation system based on execution of the emulation; a shadow removal component configured to subtract the shadow point cloud data from measured point cloud data generated by a TOF sensor that monitors an area comprising the industrial automation system to yield reduced point cloud data; and a safety analysis component configured to initiate a safety action in response to determining that the reduced point cloud data indicates a hazardous condition.

Also, one or more embodiments provide a method, comprising reading, by a system comprising a processor, controller data from an industrial controller that monitors and controls an industrial automation system; executing, by the system, an emulation of the industrial automation system based on the controller data and a digital twin of the industrial automation system; generating, by the system, shadow point cloud data for the industrial automation system based on the executing of the emulation; subtracting, by the system, the shadow point cloud data from measured point cloud data generated by a TOF sensor that monitors an area comprising the industrial automation system to yield reduced point cloud data; and initiating, by the system, a safety countermeasure in response to determining that the reduced point cloud data indicates a hazardous condition.

Also, according to one or more embodiments, a non-transitory computer-readable medium is provided having stored thereon instructions that, in response to execution, cause a system comprising a processor to perform operations, the operations comprising receiving controller data from an industrial controller that monitors and controls an industrial automation system; executing an emulation of the industrial automation system based on the controller data and a digital twin of the industrial automation system; generating shadow point cloud data for the industrial automation system based on the executing of the emulation; subtracting the shadow point cloud data from measured point cloud data generated by a TOF sensor that monitors the industrial automation system to obtain reduced point cloud data; and initiating a safety action in response to determining that a shape defined in the reduced point cloud data satisfies a condition indicative of a hazardous condition.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
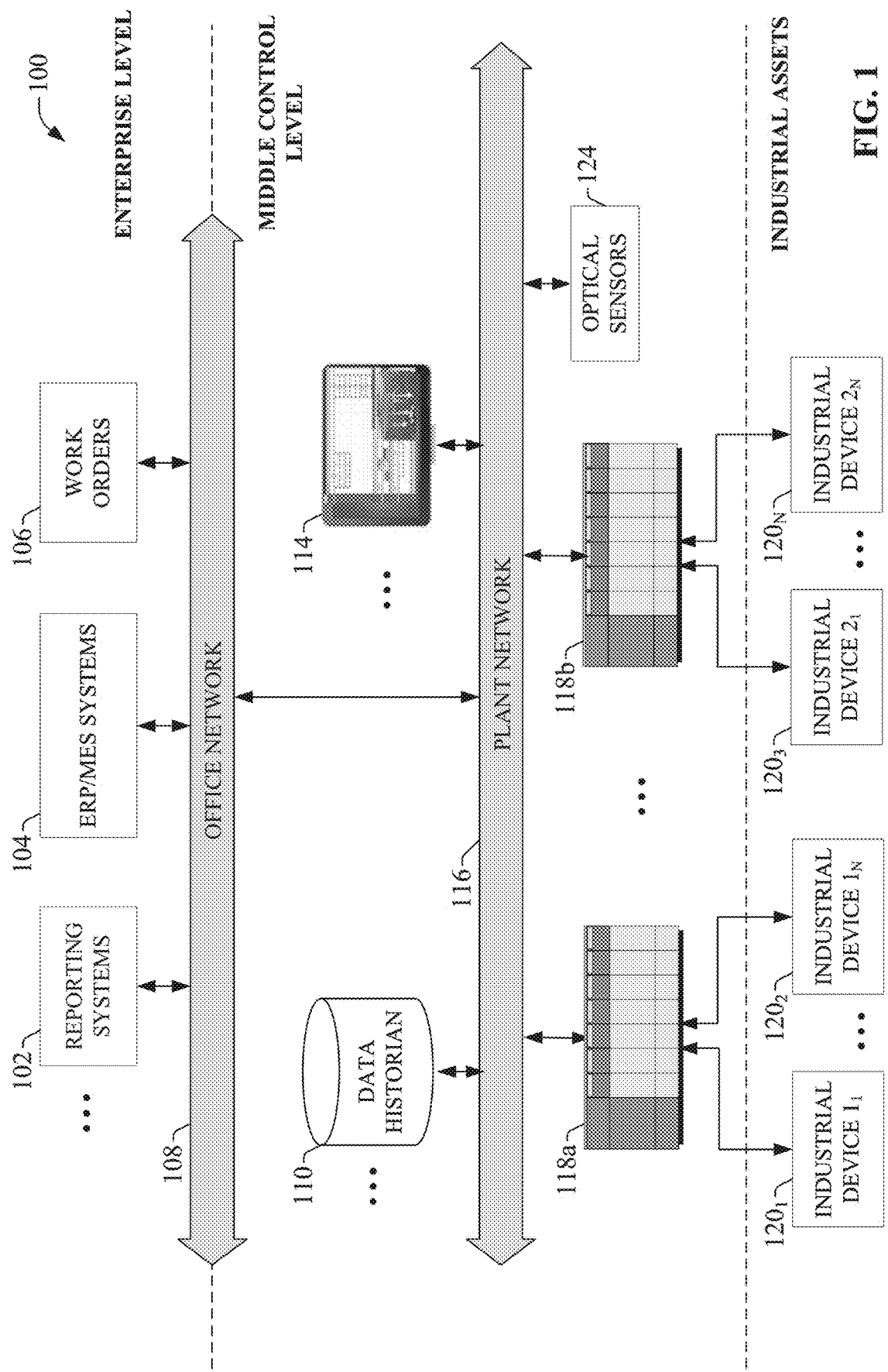
FIG. 1 is a block diagram of an example industrial control environment.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

FIG. 1 is a block diagram of an example industrial control environment 100. In this example, a number of industrial controllers 118 are deployed throughout an industrial plant environment to monitor and control respective industrial systems or processes relating to product manufacture, machining, motion control, batch processing, material handling, or other such industrial functions. Industrial controllers 118 typically execute respective control programs to facilitate monitoring and control of industrial devices 120 making up the controlled industrial systems. One or more industrial controllers 118 may also comprise a soft controller executed on a personal computer or other hardware platform, or on a cloud platform. Some hybrid devices may also combine controller functionality with other functions (e.g., visualization). The control programs executed by industrial controllers 118 can comprise any conceivable type of code used to process input signals read from the industrial devices 120 and to control output signals generated by the industrial controllers, including but not limited to ladder logic, sequential function charts, function block diagrams, or structured text.

Industrial devices 120 may include both input devices that provide data relating to the controlled industrial systems to the industrial controllers 118, and output devices that respond to control signals generated by the industrial controllers 118 to control aspects of the industrial systems. Example input devices can include telemetry devices (e.g., temperature sensors, flow meters, level sensors, pressure sensors, etc.), manual operator control devices (e.g., push buttons, selector switches, etc.), safety monitoring devices (e.g., safety mats, safety pull cords, light curtains, etc.), and other such devices. Output devices may include motor drives, pneumatic actuators, signaling devices, robot control systems, valves, and the like.

Industrial controllers 118 may communicatively interface with industrial devices 120 over hardwired or networked connections. For example, industrial controllers 118 can be equipped with native hardwired inputs and outputs that communicate with the industrial devices 120 to effect control of the devices. The native controller I/O can include digital I/O that transmits and receives discrete voltage signals to and from the field devices, or analog I/O that transmits and receives analog voltage or current signals to and from the devices. The controller I/O can communicate with a controller's processor over a backplane such that the digital and analog signals can be read into and controlled by the control programs. Industrial controllers 118 can also communicate with industrial devices 120 over a network using, for example, a communication module or an integrated networking port. Exemplary networks can include the Internet, intranets, Ethernet, DeviceNet, ControlNet, Data Highway and Data Highway Plus (DH/DH+), Remote I/O, Fieldbus, Modbus, Profibus, wireless networks, serial protocols, and the like. The industrial controllers 118 can also store persisted data values that can be referenced by the control program and used for control decisions, including but not limited to measured or calculated values representing operational states of a controlled machine or process (e.g., tank levels, positions, alarms, etc.) or captured time series data that is collected during operation of the automation system (e.g., status information for multiple points in time, diagnostic occurrences, etc.). Similarly, some intelligent devices—including but not limited to motor drives, instruments, or condition monitoring modules—may store data values that are used for control and/or to visualize states of operation. Such devices may also capture time-series data or events on a log for later retrieval and viewing.

Industrial automation systems often include one or more human-machine interfaces (HMIs) 114 that allow plant personnel to view telemetry and status data associated with the automation systems, and to control some aspects of system operation. HMIs 114 may communicate with one or more of the industrial controllers 118 over a plant network 116, and exchange data with the industrial controllers to facilitate visualization of information relating to the controlled industrial processes on one or more pre-developed operator interface screens. HMIs 114 can also be configured to allow operators to submit data to specified data tags or memory addresses of the industrial controllers 118, thereby providing a means for operators to issue commands to the controlled systems (e.g., cycle start commands, device actuation commands, etc.), to modify setpoint values, etc. HMIs 114 can generate one or more display screens through which the operator interacts with the industrial controllers 118, and thereby with the controlled processes and/or systems. Example display screens can visualize present states of industrial systems or their associated devices using graphical representations of the processes that display metered or calculated values, employ color or position animations based on state, render alarm notifications, or employ other such techniques for presenting relevant data to the operator. Data presented in this manner is read from industrial controllers 118 by HMIs 114 and presented on one or more of the display screens according to display formats chosen by the HMI developer. HMIs may comprise fixed location or mobile devices with either user-installed or pre-installed operating systems, and either user-installed or pre-installed graphical application software.

Other systems may also reside within the plant environment, including but not limited to data historians 110 that aggregate and store production information collected from the industrial controllers 118 or other data sources, reporting systems 102, work order management systems 106, enterprise resource planning (ERP) or manufacturing execution systems (MES) 104, or other such systems.

Industrial environments can also include various types of sensors that detect the presence and/or location of people and objects (e.g., parts, vehicles, machine components, etc.) within the plant. These sensors can include proximity sensors, photo-detectors, optical sensors 124 such as three-dimensional imaging sensors (e.g., time-of-flight, or TOF, cameras), laser scanners, or other such sensors. Some of these sensors may be interfaced with one or more of the industrial controllers 118, while others (e.g., optical sensor 124 depicted in FIG. 1) may operate independently of the industrial controllers. For example, some sensors may include their own I/O for directly interfacing with a machine or safety system, or may interface with a machine or controller 118 via plant network 116.

Figure 2:
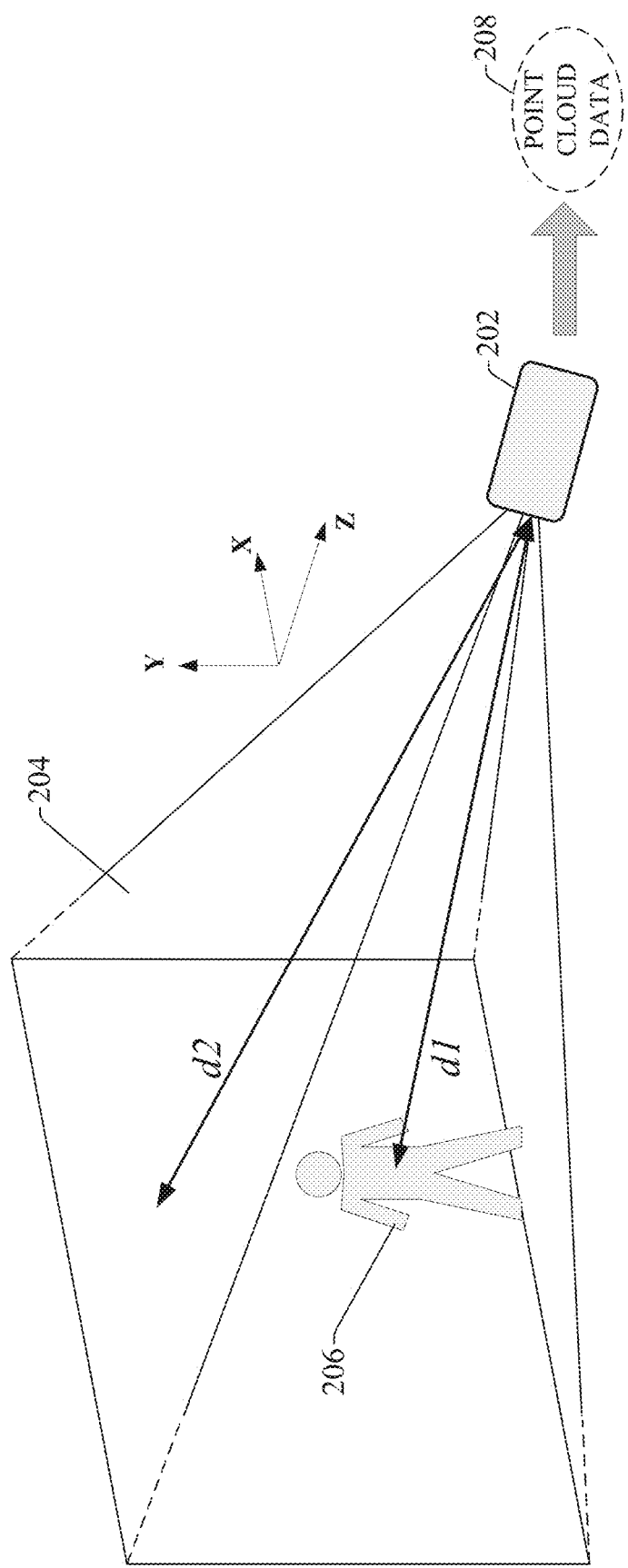
FIG. 2 is a diagram illustrating 3D image analysis using a TOF sensor.

Three-dimensional (3D) image sensors, also known as time-of-flight (TOF) sensors, are designed to generate distance information as well as two-dimensional shape information for objects and surfaces within the sensor's viewing field. FIG. 2 is a diagram illustrating 3D image analysis using a TOF sensor 202. An example TOF sensor 202 emits a beam 204 of short light pulses into a viewing field. Objects and surfaces within the viewing field, such as a person 206, reflect part of the pulses' energy back to the TOF sensor 202, and the reflected pulses are detected by respective pixels of a photo-detector or photo-sensor of the TOF sensor 202. Since the speed of light in vacuo c is a known constant and the time t elapsed between emission and reception of the pulses can be measured or extracted, the sensor's distance measurement components can determine, for each pixel of the sensor 202, the distance between a surface point corresponding to the pixel and the sensor 202 by calculating half of the round-trip time, or using another suitable calculation technique. In the example depicted in FIG. 2, the distance between a point on person 206 and the sensor 202, as measured by a pixel corresponding to that point, is given as d1, while the distance between a point on a background surface, as measured by another pixel corresponding to that point, is given by d2. Collectively, the array of distance values obtained for all pixels of the TOF sensor 202 yields a depth map or point cloud for the viewing space, which is reported by the TOF sensor 202 as point cloud data 208. As shown in FIG. 2, this 3D measurement analysis yields distance or depth information in the z-direction (that is, the distances of objects and surfaces from the sensor 202) as well as imaging information in the x-y plane.

If a TOF sensor's distance calculation capabilities are sufficiently robust and reliable, the sensor can serve as a safety device for an industrial safety system. In an example implementation, one or more TOF sensors 202 can be oriented and configured to monitor for intrusion of people 206 or objects (e.g., forklifts or other vehicles, moving machinery, etc.) within a defined protected zone. An associated functional safety system can initiate a safety action in response to determining, based on analysis of the point cloud data 208 generated by the TOF sensors 202, that an unexpected person 206 or object is within the protected zone. Such safety actions that can include, for example, disconnection of power from a hazardous automated machine, placement of the machine in a safe operating mode (e.g., a stopped or slow operating mode), altering the trajectory of the machine to avoid the path of a detected person, limiting movements of the machine, or other such safety actions.

Some industrial safety solutions rely on strictly defined, fixed safety zones, sometimes in combination with low energy state or force sensing robots. Also, functional safety systems that are designed to identify actionable hazardous scenarios based on a comprehensive analysis of all available point cloud data for a monitored area may be prone to false safety trips given the complexity of such analysis, particularly in highly dynamic collaborative environments comprising many machines and free-moving vehicles, people, and products.

To address these and other issues, one or more embodiments of the present disclosure provide a functional safety system that reduces the amount of measured 3D or point cloud data on which safety analysis will be applied. This approach can improve accuracy of hazard detection by removing known or expected elements—e.g., machines, robots, conveyors, items of product, automated guided vehicles (AGVs), etc.—from the point cloud data, such that only anomalous objects or entities are represented in the data. This reduced set of measured 3D data—representing only anomalous people or objects—can then be analyzed for potentially hazardous scenarios requiring initiation of a safety action.

To these ends, embodiments of the functional safety system can import a three-dimensional digital model or digital twin of an industrial system to be monitored. Using this digital model, the safety system emulates real-time movement of the automation system within of the industrial environment based on live control data read from one or more industrial controllers that monitor and control the physical automation system. In this way, the digital model runs as a shadow of the physical automation system. The functional safety system continuously translates the current state of the digital model to 3D point cloud data representing an expected point cloud representation of the monitored area. This shadow point cloud data is subtracted or removed from the actual point cloud data for the monitored area, as measured by one or more TOF sensors. The resulting reduced point cloud data represents only anomalous people or objects within the monitored area. This reduced point cloud data can be analyzed to determine whether the identities, locations, or movements of the anomalous entities within the environment are indicative of an unsafe situation that warrants initiation of a safety action.

Figure 3:
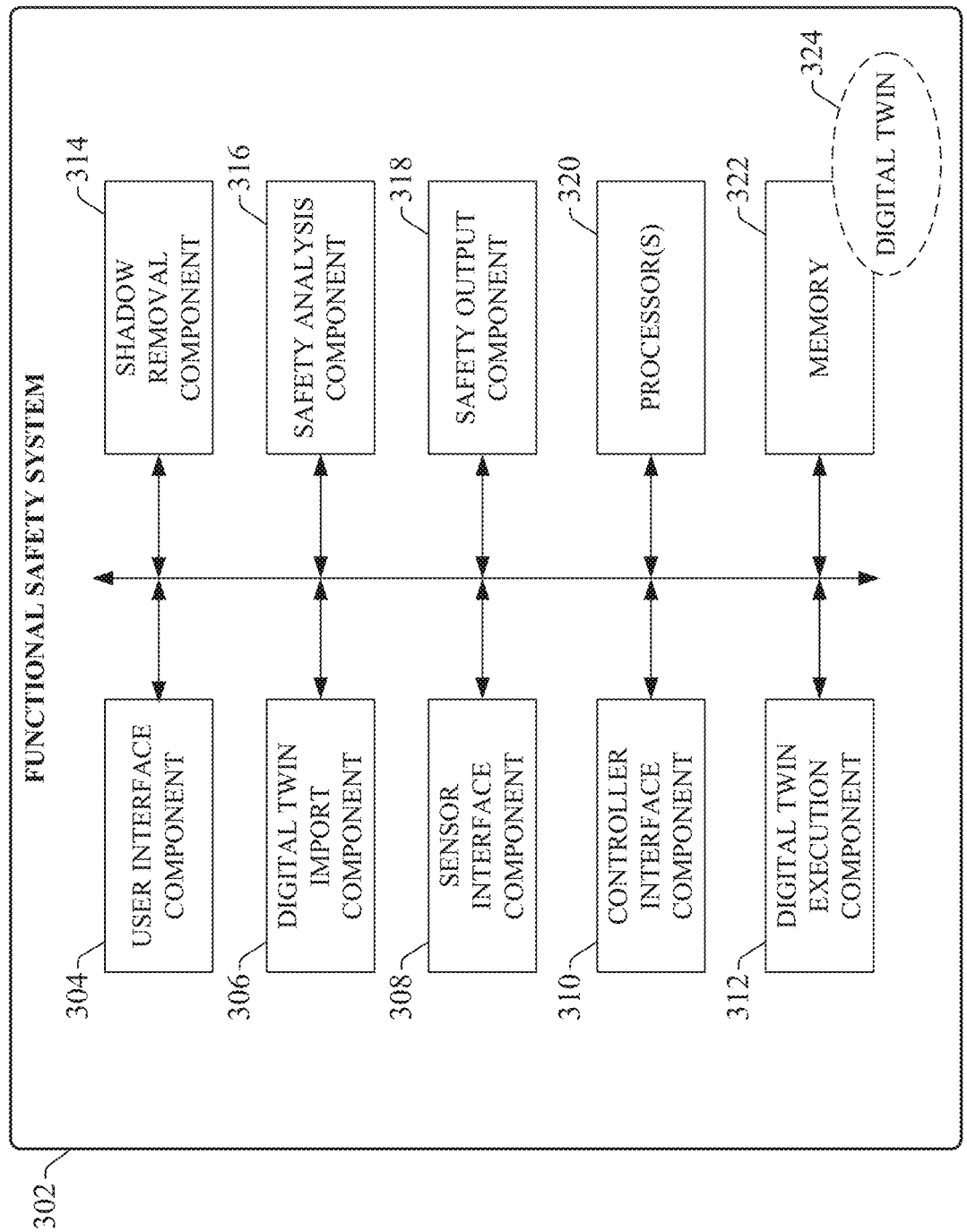
FIG. 3 is a block diagram of an example functional safety system.

FIG. 3 is a block diagram of an example functional safety system 302 according to one or more embodiments of this disclosure. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

Functional safety system 302 can include a user interface component 304, a digital twin import component 306, a sensor interface component 308, a controller interface component 310, a digital twin execution component 312, a shadow removal component 314, a safety analysis component 316, a safety output component 318, one or more processors 320, and memory 322. In various embodiments, one or more of the a user interface component 304, digital twin import component 306, sensor interface component 308, controller interface component 310, digital twin execution component 312, shadow removal component 314, safety analysis component 316, safety output component 318, the one or more processors 320, and memory 322 can be electrically and/or communicatively coupled to one another to perform one or more of the functions of the functional safety system 302. In some embodiments, components 304, 306, 308, 310, 312, 314, 316, and 318 can comprise software instructions stored on memory 322 and executed by processor(s) 320. Functional safety system 302 may also interact with other hardware and/or software components not depicted in FIG. 3. For example, processor(s) 320 may interact with one or more external user interface devices, such as a keyboard, a mouse, a display monitor, a touchscreen, or other such interface devices.

User interface component 304 can be configured to exchange data with a client device, such as a desktop, laptop, or tablet computer; a mobile device such as a smart phone; or other such client device. In various embodiments, user interface component 304 can generate and deliver graphical interface displays to the client device that render system outputs and receive input data via a user's interaction with the interface displays. Example system outputs that can be rendered by the user interface component 304 can include, but are not limited to, views of measured point cloud data for a monitored industrial environment, views of shadow point cloud data generated by the system 302 based on a digital model of the industrial environment and real-time control data read from an industrial controller, indications of anomalous objects or entities detected within the environment, a log of safety actions initiated by the system 302, or other such information. The user interface component 304 can also render configuration displays that allow a user to train the system 302 to recognize conditions that are to initiate safety actions, or other such interface displays.

Digital twin import component 306 can be configured to import a digital twin 324 of an industrial automation system, or another type of digitized model of the automation system. Sensor interface component 308 can be configured to receive 3D point cloud data generated by one or more TOF sensors that are oriented to monitor the industrial environment represented by the digital twin 324. Controller interface component 310 can be configured to read values of control inputs and outputs from an industrial controller (e.g., from data tags defined on the industrial controller)

Digital twin execution component 312 can be configured to execute an emulation of the monitored automation system based on the digital twin 324 and the values of the control inputs and outputs read from the industrial controller via the controller interface component 310, and to translate a current state of the emulation to a set of shadow point cloud data representing expected current states of the industrial assets within the monitored area. Shadow removal component 314 can be configured to remove the shadow point cloud data generated by the digital twin execution component 312 from the measured point cloud data received by the sensor interface component 308 from the TOF sensors in the field to yield reduced point cloud data.

The safety analysis component 316 can be configured to monitor the reduced point cloud data generated by the shadow removal component 314 to identify anomalous entities that are represented in the reduced point cloud data and to determine whether the identities, locations, or movements of the anomalous entities necessitate a safety action. Safety output component 318 can be configured to generate a safety output in response to a determination by the safety analysis component 316 that a safety action is to be taken.

The one or more processors 320 can perform one or more of the functions described herein with reference to the systems and/or methods disclosed. Memory 322 can be a computer-readable storage medium that stores computer-executable instructions and/or information for performing the functions described herein with reference to the systems and/or methods disclosed.

Figure 4:
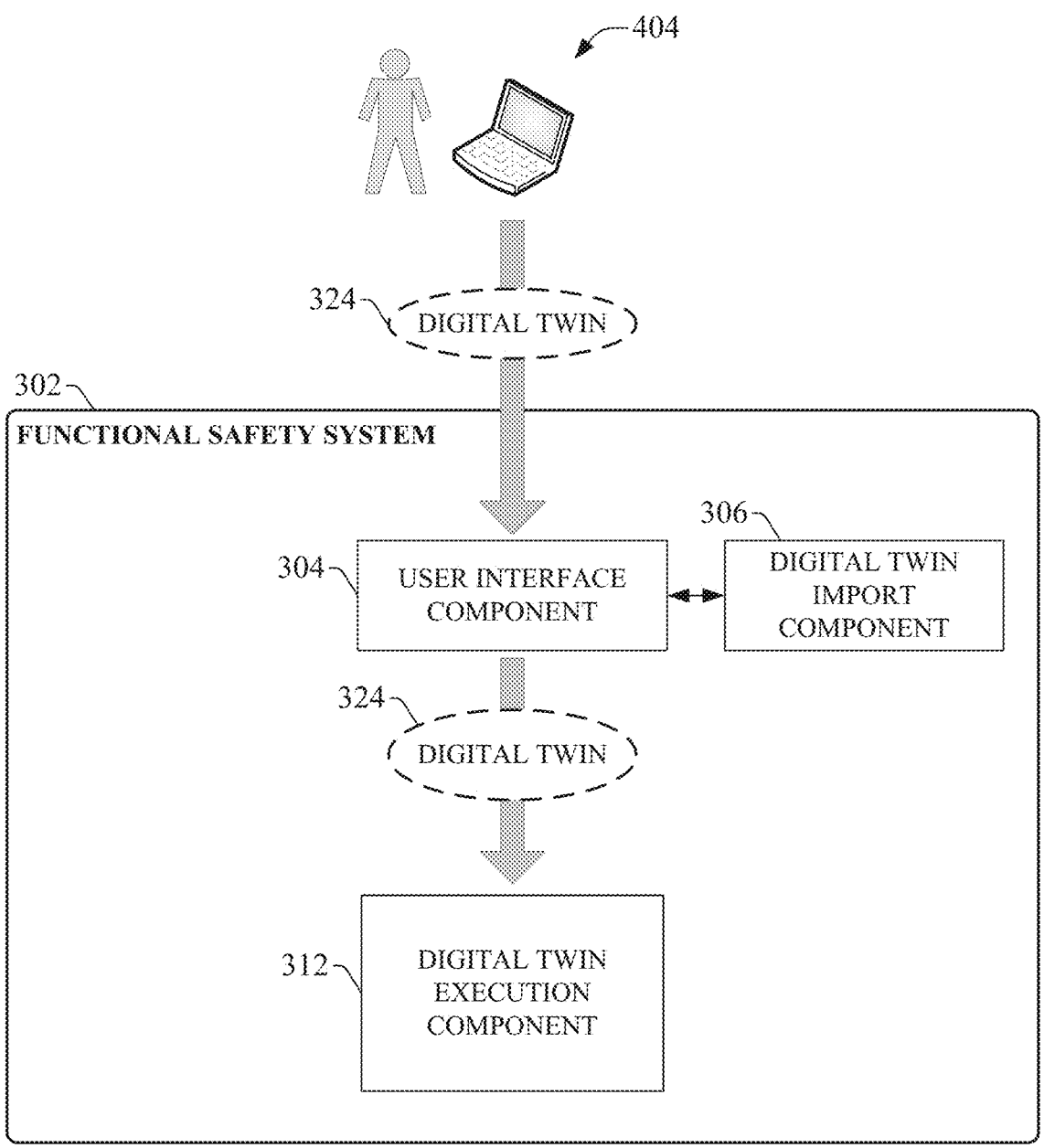
FIG. 4 is a diagram illustrating importation of a digital twin into a functional safety system.

As noted above, embodiments of functional safety system 302 can perform continuous safety monitoring of a hazardous industrial area using a digitized model—or digital twin—of the industrial assets within the area being monitored. FIG. 4 is a diagram illustrating importation of a digital twin 324 into the functional safety system 302. According to an example workflow for importing the digital twin 324, user interface component 304 can generate and deliver suitable graphical interface displays to a client device 404, the interface displays including interactive features that allow a user to select the digital twin 324 to be imported (either from local storage on the client device 404 or from a networked location) and to initiate the import. In response to initiation of the import operation, digital twin import component 306 can retrieve and store the selected digital twin 324 on the functional safety system's local storage for execution by the digital twin execution component 312.

In the case of new automation system installations, or automation systems for which digital design information is available, digital twin 324 may be a digital model of the automation system (e.g., a computer-aided design, or CAD, model) that was previously generated by a separate industrial design platform during design of the automation system. The digital twin 324 can encode information about the construction of the automation system, and can also be visualized by a suitable visualization application (e.g., the original design platform in which the digital twin 324 was developed, or the functional safety system 302) to render a three-dimensional virtual representation of the automation system.

The digital twin 324 comprises information that models the equipment and devices that make up the automation system within the monitored area, including machinery (e.g., motor-driven machines, industrial robots, motion systems, etc.), conveyors, safety barriers, structural components, control devices such as industrial controllers or motor drives, safety input devices, and other aspects of the automation systems. The digital twin 324 can also model the locations, orientations, and functionalities of the equipment and devices, as well as relationships between the modeled components of the automation systems. Thus, the digital twin 324 models both the physical appearance of the industrial assets within the monitored area as well as the expected movements or behaviors of these industrial assets during operation (e.g., the assets' responses to control inputs in terms of movement, speed, temperatures, flows, fill levels, etc.), allowing the digital twin 324 to serve as a virtual automation system that mimics the behaviors of the physical industrial assets within the monitored area, as will be discussed in more detail below.

In the case of existing automation systems for which no digital twin 324 was developed during the design phase, a digital twin 324 can be created by other means; e.g., using three-dimensional digitization scanning of the automation system to yield the digital twin 324.

In some embodiments, in addition to digitally representing fixed industrial assets or entities within the industrial area to be monitored (e.g., machines, industrial robots, conveyors, safety fencing and gates, etc.), the digital twin 324 can also model entities that are expected to enter and leave the monitored area at various times, such as items of product, AGVs, or other such entities.

Figure 5:
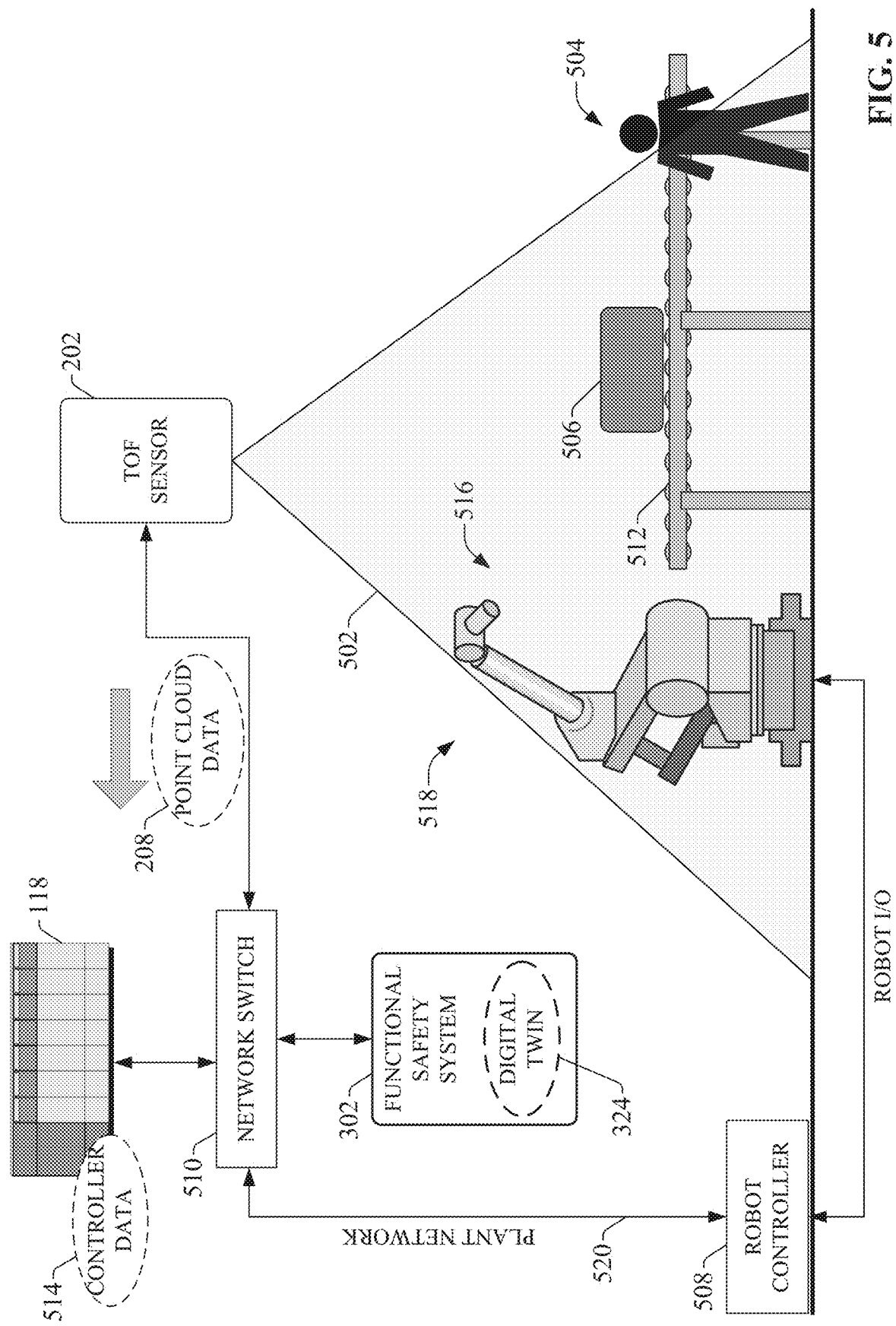
FIG. 5 is a view of an example, simplified industrial automation system that incorporates one or more embodiments of the functional safety system.

Once the digital twin 324 has been imported, functional safety system 302 is communicatively interfaced with the one or more industrial controllers 118 that monitor and control the industrial assets within the monitored hazardous area. The system 302 is also interfaced with the one or more TOF sensors 202 that monitor the hazardous area. FIG. 5 is a view of an example, simplified industrial automation system that incorporates one or more embodiments of functional safety system 302. The architecture depicted in FIG. 5 is only intended to be exemplary, and it is to be appreciated that other architectures for integrating functional safety system 302 into an industrial control system are within the scope of one or more embodiments.

In this example, a TOF sensor 202 (or another type of 3D sensor) is mounted such that the sensor's field of view 502 encompasses a hazardous industrial area 518 within which an industrial robot 516 operates to remove products 506 from, or place products 506 on, a conveyor 512. The viewing space monitored by the TOF sensor 202 constitutes a safety zone in which the locations and movements of objects and people will be detected and tracked by the functional safety system 302 so that the behavior of robot 516 can be suitably altered in response to detection of a potential hazardous interaction between robot 516 and a human 504 detected in the area 518. Although only one TOF sensor 202 is depicted in FIG. 5, in some implementations multiple TOF sensors 202 may be installed to monitor the area 518 from multiple angles. In this example, robot 516 is controlled by a robot controller 508 that exchanges status and control data with the robot 516 via robot I/O. The robot 516 operates as part of a larger automation system controlled by the industrial controller 118. Industrial controller 118 and robot controller 508 can exchange data via plant network 520 and one or more network infrastructure devices, such as a network switch 510.

In this example, functional safety system 302 also resides on the plant network 520. During operation of the industrial assets, TOF sensor 202 monitors the industrial area 518 and generates 3D point cloud data 208 representing the sensor's view of the monitored area 518. The functional safety system 302 receives this point cloud data 208 from the TOF sensor 202, either via a direct connection between the functional safety system 302 and the sensor 202 or via the plant network 420 as shown in FIG. 5. Functional safety system 302 also retrieves, on a substantially continuous basis, controller data 514 from the industrial controller's data table (e.g., from data tags defined on the industrial controller). This controller data 514 comprises values of the controller's analog and digital inputs, outputs, and user-defined data tags. As such, the controller data 514 represents the current statuses of the industrial assets within the monitored area 518 as measured by various input devices (e.g., sensors, motor drives, telemetry devices, robot controller outputs, smart devices, etc.) that are interfaced with the controller's inputs, as well as the current states of the control outputs that are sent by the controller 118 to output devices (e.g., pneumatic actuators, robot controller inputs, motor drives, servos, etc.) that facilitate control of the industrial assets. As will be described in more detail below, functional safety system 302 processes the point cloud data 208 by removing known or expected elements, as determined based on the digital twin 324 and real-time controller data 514, to yield a reduced point cloud that can be analyzed for potentially hazardous conditions.

Figure 6:
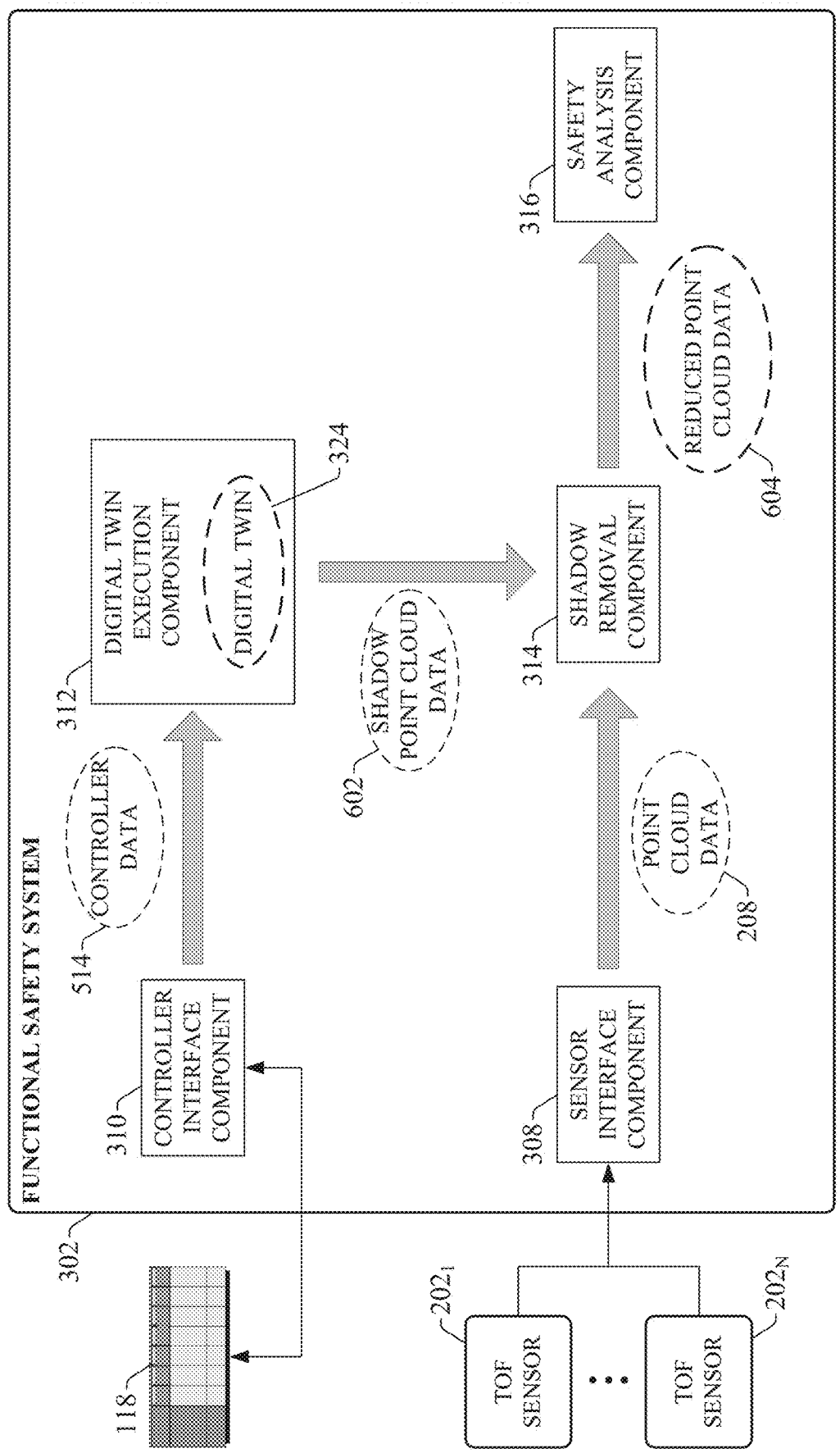
FIG. 6 is a diagram illustrating example data processing that can be performed by embodiments of the functional safety system to transform point cloud data received from a TOF sensor into reduced point cloud data suitable for safety analysis.
Figure 7:
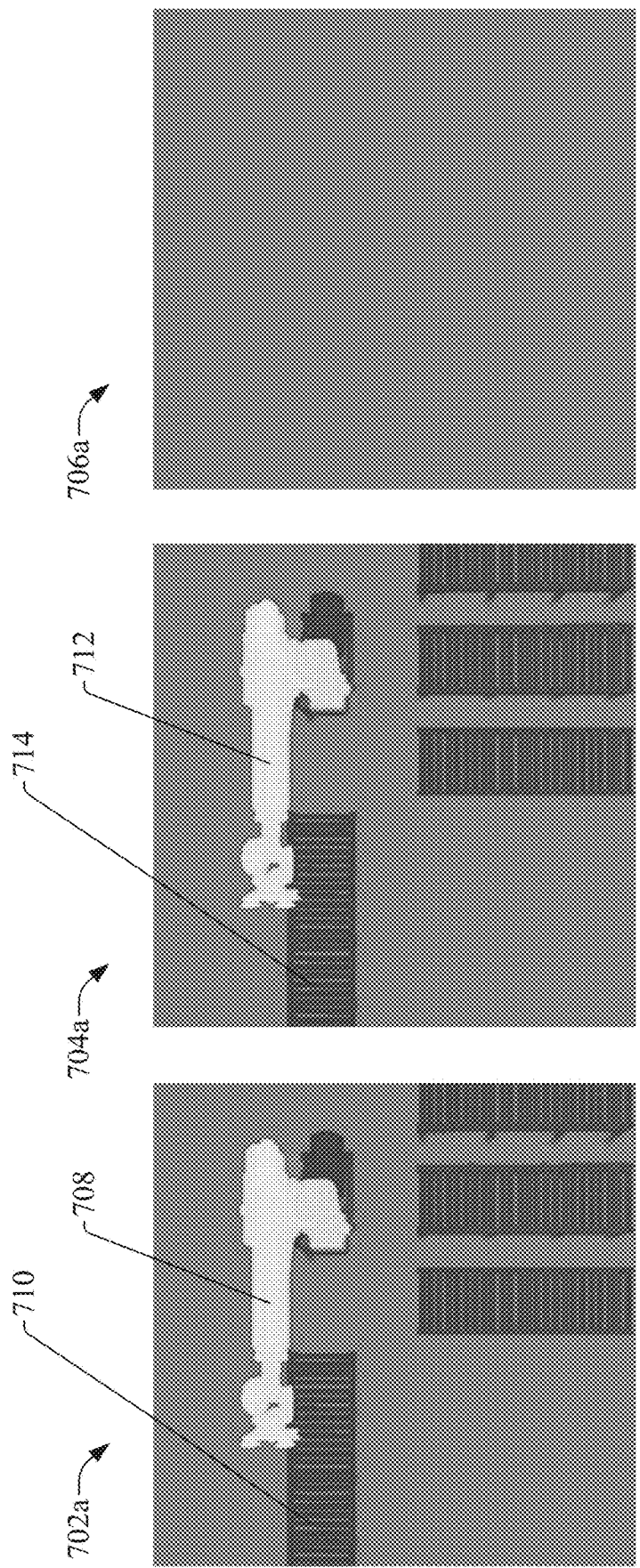
FIG. 7 is a set of images representing measured point cloud data, shadow point cloud data, and reduced point cloud data comprising no anomalous entities.

FIG. 6 is a diagram illustrating example data processing that can be performed by embodiments of the functional safety system 302 to transform point cloud data 208 received from the TOF sensor 202 into reduced point cloud data 604 suitable for safety analysis. During operation of the automation system (e.g., the robot 516 and conveyor 512 in the example depicted in FIG. 5), the TOF sensor 202 measures distance values for respective surface points within the sensor's viewing field and generates point cloud data 208 comprising an array of the measured distance values, as described above in connection with FIG. 2. This point cloud data 208 represents a three-dimensional topology of the monitored area 518, including the industrial assets and any unexpected entities that may have entered the area 518. Referring briefly to FIG. 7, image 702*a* is a visualization of example point cloud data 208 for an instant in time. Each pixel of the image 702*a* corresponds to a point within the sensor's field of view and has an associated distance value measured for that point by the sensor 202. Shapes within the field of view can be delineated based on these distance values. In the example image 702a depicted in FIG. 7, shape 708 represents the industrial robot 516, and shape 710 represents conveyor 512 (one of multiple conveyors within the sensor's field of view). Since the TOF sensor 202 continuously monitors the hazardous area 518, the point cloud data 208 is continuously updated to depict the current positions, locations, or orientations of shapes representing movable entities, such as the industrial robot 704, items of product 506, and movable entities that enter and leave the field of view (e.g., people and vehicles).

Returning to FIG. 6, the sensor interface component 308 receives the point cloud data 208 generated by the TOF sensor 202 for processing by the functional safety system 302. If multiple TOF sensors 202 are used to monitor the area 518, the sensor interface component 308 can integrate the point cloud data 208 from these various TOF sensors 202 to yield a single set of point cloud data 208 representing the monitored area 518. In parallel with collection of point cloud data 208 from the TOF sensor 202, the system's controller interface component 310 also collects controller data 514 from the industrial controller 118 that monitors and controls the industrial assets that make up the automation system (e.g., the industrial robot 516, the motor drives that control movement of the conveyor 512, etc.). The controller interface component 310 can collect items of the controller data 514 from controller's data table; e.g., from analog and digital data tags defined on the controller 118. As noted above, data items that make up controller data 514 include values of the analog and digital input signals received at the controller's inputs from respective input devices, values of the controller's analog and digital output signals directed to output devices or systems, and calculated values of user-defined controller tags. Collectively, these items of controller data 514 represent the current statuses or states of the various industrial assets that make up the monitored automaton system. Similar to the point cloud data 208, the controller data 514 is collected by the functional safety system 302 on a substantially continuous basis.

Digital twin execution component 312 is configured to use the retrieved controller data 514 and the digital twin 324 to emulate operation of the automation system in parallel with actual operation of the physical automation system. The digital twin 324 is designed to model the behavior of the physical automation system—in terms of movements, velocities, positions, etc.—in response to control output signals generated by the industrial controller 118. To this end, the digital twin's modeling of the automation system can include virtualized I/O, which the digital twin execution component 312 can interface with items of the controller data 514 representing corresponding input and output signals of the industrial controller 118. Based on the real-time values of the controller's input and outputs, as read from the controller data 514, and the expected behaviors of the various industrial assets that make up the automation system in response to these inputs and outputs, as modeled by the digital twin 324, the digital twin execution component 312 emulates the movements of the physical industrial assets in parallel with the automation system's actual operation. This emulated behavior substantially mirrors the actual behavior of the monitored automation system, and as such serves as a digital or virtual shadow of the physical automation system.

During this real-time emulation, the digital twin execution component 312 translates the emulated behaviors of the digital twin 324 to a set of shadow point cloud data 602 representing the expected point cloud currently being output by the TOF sensor 202. Digital twin execution component 312 generates this shadow point cloud data 602 to simulate the perspective of the TOF sensor's field of view relative to the physical automation system. In an example embodiment, the functional safety system 302 can be provided with training data specifying the TOF sensor's position and orientation relative to the physical automation system. Based on this known position and orientation of the TOF sensor 202, the digital twin execution component 312 can apply an appropriate rendering technique (e.g., ray tracing or another approach) to the digital shadow emulation to generate simulated pixel-wise distance values. These simulated distance values represent distances between respective points of the virtual emulated automation system and a pixel array of an imaginary TOF sensor having a position and orientation, relative to the virtual automation system, matching those of the actual TOF sensor 202 relative to the physical automation system. Since the current state of the emulated digital twin 324 is presumed to mirror that of the physical automation system, the distance values represented by the shadow point cloud data 602 are expected to substantially match, on a pixel-by-pixel basis, the distance values of the point cloud data 208 currently being received from the TOF sensor 202, provided no anomalous objects are currently within the sensor's field of view.

Returning again to FIG. 7, image 704a is a visualization of example shadow point cloud data 208 for the same instant in time as that of image 702a. Since digital twin execution component 312 generates the shadow point cloud data 208 from a perspective that matches that of the TOF sensor 202, the identities, orientations, and locations of the shapes delineated in shadow image 704a substantially match those of the measured point cloud image 702a, provided no unexpected or anomalous entities are currently within the TOF sensor's field of view. As such, similar to image 702a, shadow image 704a includes a shape 712 corresponding to the industrial robot 516 and having the same shape, size, orientation, and location within the frame as shape 708 in measured image 702a. Similarly, shadow image 704a also includes a shape 714 corresponding to conveyor 512 (as well as other conveyors modeled by the digital twin 324) and having the same shape, size, orientation, and location as corresponding shape 710 in the measured image 702a.

Since known or expected entities within the monitored area 518—e.g., machines, robots, conveyors, safety fencing, etc.—are also modeled by the digital twin 324, and the emulated behaviors of these entities substantially follow or mirror the actual behaviors of the physical entities during operation, each emulated distance value included in the shadow point cloud data 602 can be expected to match its corresponding distance value in the measured point cloud data 208 in the absence of anomalous or unexpected entities within the monitored area 518. Therefore, subtracting the shadow point cloud data 602 from the measured point cloud data 208 yields a simplified point cloud comprising only shapes that correspond to anomalous entities (e.g., people, vehicles, etc.) currently present within the TOF sensor's field of view. Returning to FIG. 6, to simplify subsequent safety analysis of the measured point cloud data 208, the system's shadow removal component 314 reduces the amount of point cloud data 208 to be analyzed by subtracting each distance value of the shadow point cloud data 602 from its corresponding distance value of the measured point cloud data 208 (that is, the distance value corresponding to the same pixel of the pixel array) to yield reduced point cloud data 604. This effectively removes shape information for the known or expected entities within the TOF sensor's field of view from the measured point cloud data 208, such that the reduced point cloud data 604 comprises solely distance information for anomalous entities within the TOF sensor's field of view.

In the example depicted in FIG. 7, removal of the shadow point cloud data represented by image 704a from the measured point cloud data represented by image 702a yields a reduced point cloud image 706a (a visualization of the reduced point cloud data 604). Since no anomalous objects are currently within the TOF sensor's field of view in this example, the reduced point cloud image 706a is a blank image comprising zero or near zero values for all points of the data array, and is therefore suggestive of a safe condition (i.e., no anomalous objects are detected within the sensor's field of view).

Figure 8:
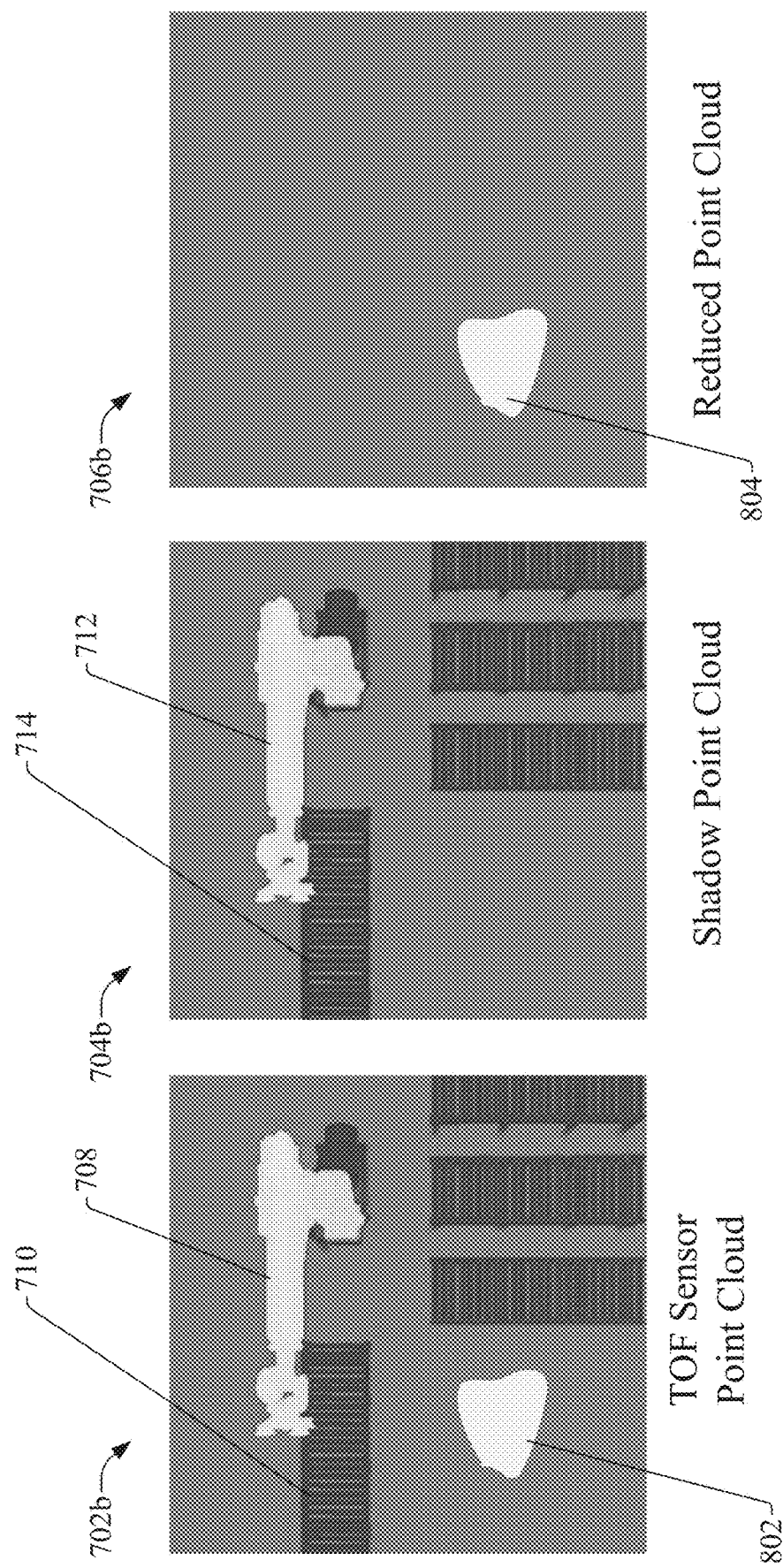
FIG. 8 is a set of images representing measured point cloud data, shadow point cloud data, and reduced point cloud data comprising an anomalous entity.

FIG. 8 depicts a set of point cloud images for another scenario in which an anomalous object or entity has entered the TOF sensor's field of view. In this example, measured image 702b (a visualization of measured point cloud data 208) includes a shape 802 that is not modeled by the digital twin 324 and is therefore not present in the shadow image 704b (a visualization of shadow point cloud data 602). Consequently, when the shadow removal component 314 removes or subtracts the shadow point cloud data 602 from the measured point cloud data 208 as described above, the resulting reduced point cloud image 706b (a visualization of the reduced point cloud data 604) comprises only a shape 804 corresponding to the anomalous entity, with the other known or expected entities removed. Shape 804 represents a cluster of non-zero distance values that remain in the reduced point cloud data 604 after the shadow data is removed from the measured data.

Reducing the measured point cloud data 208 to a simplified set of reduced point cloud data 604 comprising only unexpected entities or objects reduces the complexity of the data set on which subsequent safety analysis will be performed. In this regard, data corresponding to known or expected entities within the point cloud (e.g., the machines and associated safety guarding that make up the automation system within the monitored area 518) can be considered noise from the standpoint of safety analysis, since these entities are already known to be present within the monitored scene. Consequently, removing this noise from the point cloud can render the safety analysis more accurate and reduce occurrences of false safety trips by narrowing the focus of the safety analysis only to anomalous entities represented in the data 604.

For example, in some embodiments, if the reduced point cloud data 604 comprises only zero or near zero distance values (as in the case of image 706a in FIG. 7), the system 302 assumes that no anomalous entities are within the TOF sensor's field of view and, consequently, that no further safety analysis need be applied. Alternatively, if the reduced point cloud data 604 comprises one or more clusters of non-zero values, or values that exceed a defined threshold indicative of the presence of an anomalous entity (e.g., shape 804 in image 706b), further safety analysis can be applied to the anomalous shapes present in the reduced point cloud data 604 to determine whether a safety action should be initiated.

In the example depicted in FIG. 6, functional safety system 302 comprises a safety analysis component 316 that can perform safety analysis on the reduced point cloud data 604. Substantially any type of safety analysis can be performed on the reduced point cloud data 604 without departing from the scope of one or more embodiments. For example, safety analysis component 316 may first determine whether the reduced point cloud data 604 includes one or more clusters of non-zero distance values indicative of the present of an anomalous entity within the monitored area 518. If no such non-zero values are present, the safety analysis component 316 may apply no further analysis. Upon detecting the presence of non-zero distance values in the reduced point cloud data 604 indicative of an anomalous entity—e.g., due to a person or vehicle entering the monitored are 518—the safety analysis component 316 can delineate the three-dimensional entity defined by the distance values (e.g., shape 804 in image 706b) and analyze the shape, size, location, and movement of the entity within the TOF sensor's viewing field.

According to an example analysis, the safety analysis component 316 can first determine a classification for the entity discovered in the reduced point cloud data 604 based on the shape of the boundaries of the detected object in the x-y plane, as determined by applying edge detection analysis on the reduced point cloud data 604. In some embodiments, the safety analysis component 316 may also determine a classification for the entity based on part on the topology of the anomalous object, as determined based on the z-axis distance values associated with the pixels within the object's boundaries. The safety analysis component 316 can determine the classification for the anomalous entity by cross-referencing the shape and/or topology of the entity with pre-defined classes of entities that the safety analysis component 316 has been trained to identify, including but not limited to human beings, one or more types of vehicles (e.g., forklifts, trolleys, etc.), a manufactured part, a pallet, or other such object classifications.

Figure 9:
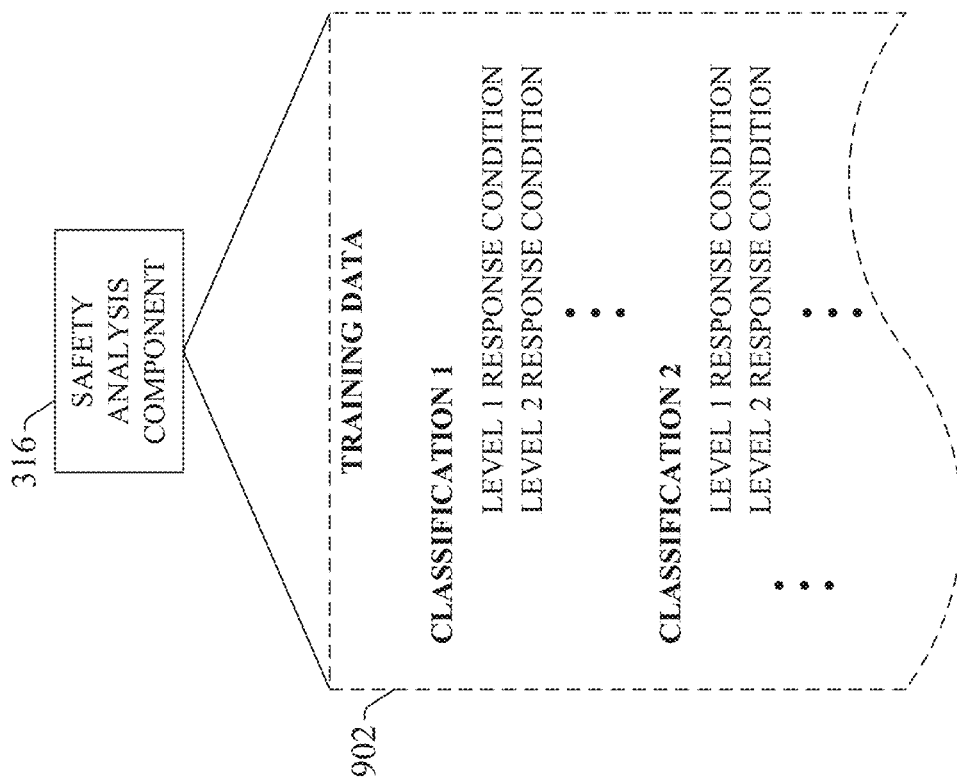
FIG. 9 illustrates example training data that can be used to train a safety analysis component to recognize hazardous conditions for different classifications of anomalous entities, and to determine a suitable safety countermeasure in response to these hazardous conditions.

Once the anomalous object has been classified, safety analysis component 316 can determine whether the classified object's location and/or trajectory within the monitored scene constitutes a hazardous condition requiring initiation of a safety action. FIG. 9 illustrates example training data 902 that can be used to train safety analysis component 316 to recognize hazardous conditions for different classifications of anomalous entities, and to determine a suitable safety countermeasure in response to these hazardous conditions. In general, the determination of whether an anomalous entity's location or trajectory constitutes a hazardous condition can depend on the classification of the entity (e.g., human, autonomous vehicle, etc.). Accordingly, safety analysis component 316 can be trained to recognize, for each pre-defined entity classification, locations or movements of the entity within the monitored area that will cause a safety action to be initiated. For example, if the entity is classified as an AGV or forklift that has entered the monitored area 518, the safety analysis component 316 may allow the entity greater freedom of movement within the monitored area 518 without initiating a safety action than would be permitted for entities classified as a human beings.

To facilitate differentiation of safety actions according to entity classification, training data 902 can define, for each of multiple defined entity classifications (e.g., human beings, AGVs, forklifts, etc.), one or more conditions or behaviors of entities within that classification that will cause the functional safety system 302 to trigger a safety response. These conditions and behaviors can be defined in terms of locations, trajectories, and/or speeds of the anomalous entity within the TOF sensor's field of view that will trigger a specified safety action. For example, the training data 902 may specify that an anomalous entity classified as a forklift will cause the functional safety system 302 to trigger a safety action if the entity crosses into a specified area of the TOF sensor's field of view, where the specified area may be set to correspond to an area within a certain distance of the industrial robot 516. Similarly, the training data 902 may specify that an anomalous entity classified as a human being will also trigger a safety action if the entity crosses into a specified area of the TOF sensor's field of view; however, in this case the specified area may have a different size or shape than that associated with the forklift. In this way, the conditions that trigger a safety action can be made dependent on the identity of the anomalous entity detected in the reduced point cloud data 604.

In some embodiments, the safety analysis component 316 may also be trained to differentiate between different types of unsafe conditions for a given entity classification, and to assign different types of safety actions (e.g., a Level 1 response, a Level 2 response, etc.) to the different types of unsafe conditions. These different types of safety actions can include, but are not limited to, disconnecting power from an industrial machine, stopping operation of the machine without disconnecting power, instructing the machine to switch to a safe operating mode (e.g., a slow mode), limiting the range of movement of the machine, triggering a visual or audio warning (e.g., a stack light or a horn), or other such safety actions. In an example scenario, a Human Being classification can be associated with multiple different safety actions, each associated with a different condition or behavior for initiating that action. The training data 902 may specify that a first response—activation of an audible warning siren—will be initiated when the entity is within a first defined area of the TOF sensor's frame of reference. This first defined area can correspond to a distance from an industrial robot considered safe but approaching a minimum safe distance from the robot. The training data 902 can further specify that a second response—e.g., transitioning the robot to a slow operating mode—will be initiated either when the person is within a second area that is closer to the robot than the first area, or if the user's speed and trajectory suggests that the person will soon enter the second area. A third response—disconnecting power to the robot's motors—can be initiated when the person is within a third area deemed unsafe for robot operation. This third area can be defined by the minimum safe distance.

Although the foregoing examples describe an embodiment that supports different, context-specific levels of safety actions, embodiments of functional safety system 302 may only support a single type of safety action (e.g., removal of power from hazardous machinery) are also within the scope of one or more embodiments of this disclosure.

Figure 10:
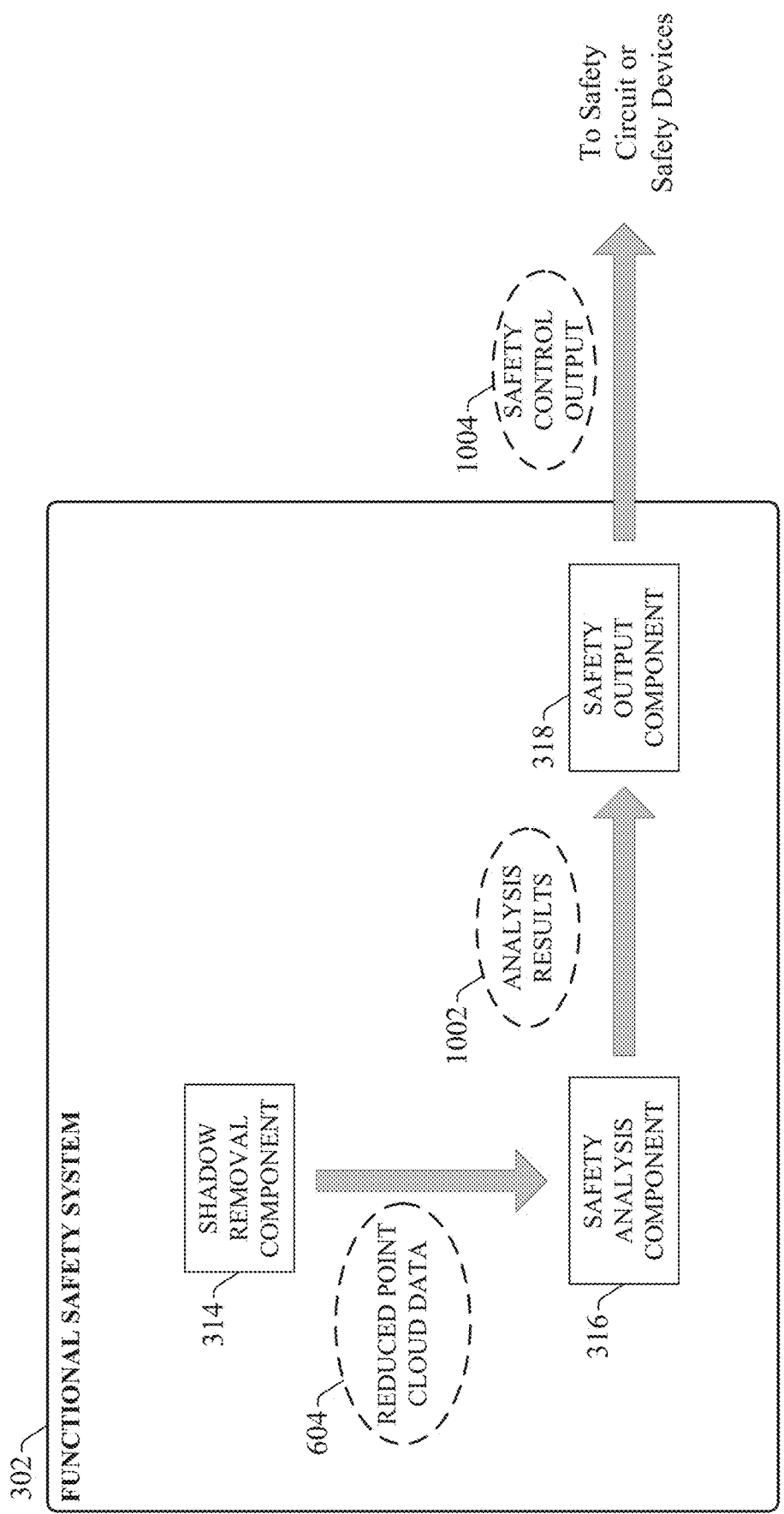
FIG. 10 is a diagram illustrating generation of a safety control output by the functional safety system.

In response to detecting that an anomalous entity of an identified class satisfies a condition requiring initiation of a safety action, as determined based on analysis of the reduced point cloud data 604 in view of training data 902, the functional safety system 302 can generate a control output that initiates the specified control action. FIG. 10 is a diagram illustrating generation of a safety control output 1004 by the functional safety system. Safety analysis component 316 analyzes the reduced point cloud data 604 as discussed above and, if an anomalous entity satisfying a condition requiring a control action is detected, sends analysis results 1002 to the system's safety output component 318. The analysis results 1002 instruct the safety output component 318 to initiate a safety action and, if the functional safety system 302 supports different safety actions, identifies the safety action to be initiated. In response, the safety output component 318 generates and sends a safety control output 1004 configured to implement the specified safety action. As noted above, example safety actions that can be initiated by the safety control output 1004 can include disconnecting power to hazardous machinery (e.g., by causing a safety relay to open), placing a machine in a safe operating mode (e.g., a stopped mode, a slow operating mode, a mode that limits the movement of the machine, etc.), activating an audible or visual warning, or other such safety actions. In some implementations, the safety output component 318 can be interfaced with an industrial safety circuit comprising one or more safety relays, such that the safety control output 1004 causes the safety relays to open and disconnect power from hazardous equipment if instructed by the analysis results 1002.

Emulation of the monitored automation systems using the digital twin 324 and live controller data 514, processing of point cloud data 208 to obtain reduced point cloud data 604, and analysis of this reduced point cloud data 604 to identify potentially hazardous scenarios, as described above, is performed on a continuous or substantially continuous basis by the functional safety system 302 so that the locations and movements of anomalous objects can be accurately tracked on a substantially real-time basis, ensuring that safety actions are triggered by the safety control output 1004 in time to prevent injury or damage.

Although the illustrated examples depict the functional safety system 302 as including an integrated safety analysis component 316 and safety output component 318, some embodiments may instead send the reduced point cloud data 604 to a separate safety system, which can then analyze the reduced point cloud data 604 for the presence of anomalous entities and determine whether the locations or behaviors of these entities necessitate initiation of a safety action. This separate system can also be responsible for initiating the appropriate safety action based on this analysis of the reduced point cloud data generated by system 302.

Embodiments of the functional safety system described herein can improve accuracy of industrial safety monitoring analysis by simplifying the 3D point cloud data generated for an industrial area being monitored prior to performing the safety analysis, reducing the complexity of the monitored data and thereby reducing the risk of a false safety trigger. This approach can be particularly beneficial in highly dynamic and collaborative industrial areas comprising many industrial assets, since the functional safety system 302 can remove a large amount of data noise representing known or expected industrial equipment from the data set under analysis.

Figure 11A:
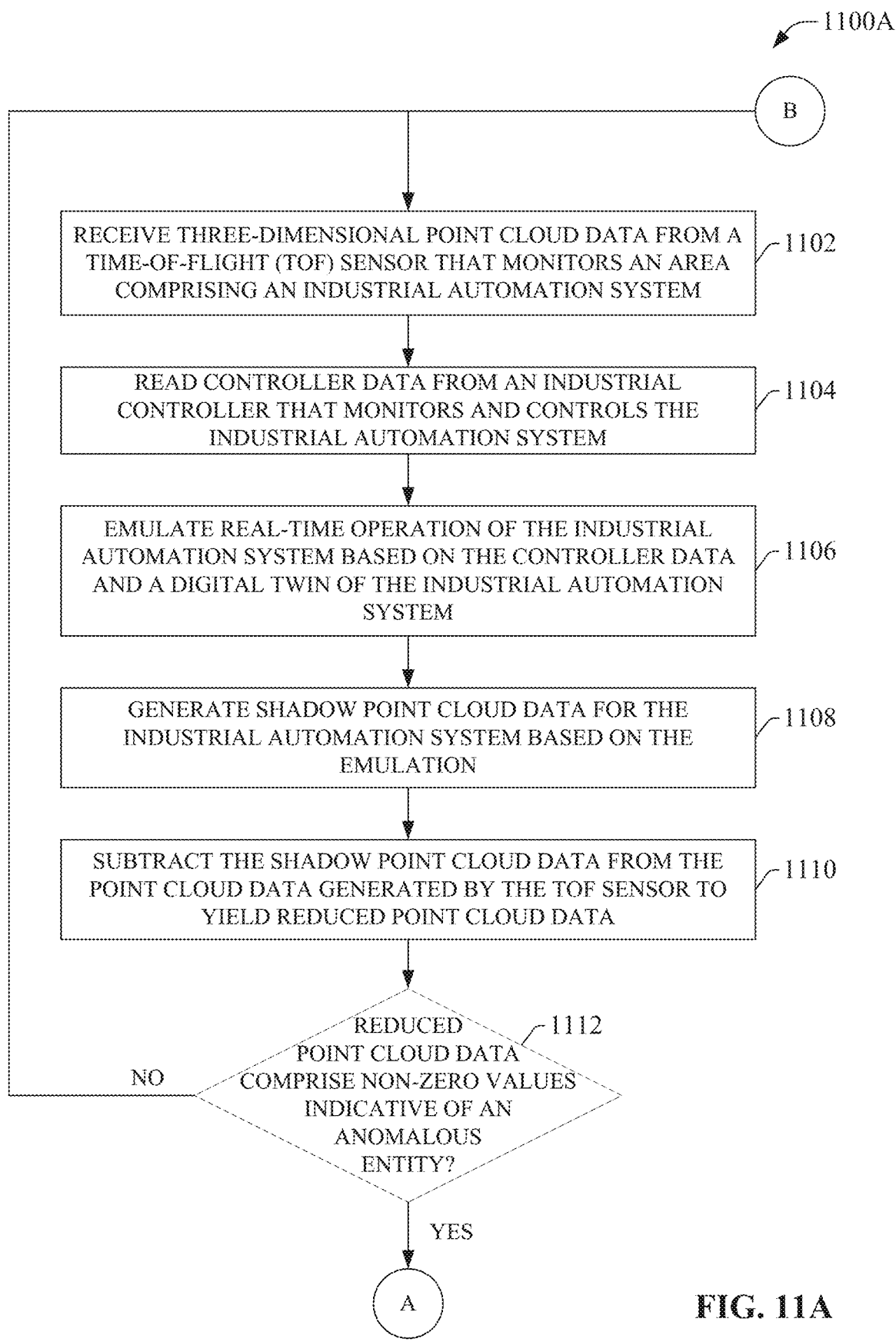
FIG. 11A is a flowchart of a first part of an example methodology for performing safety monitoring of a hazardous industrial space.
Figure 11B:
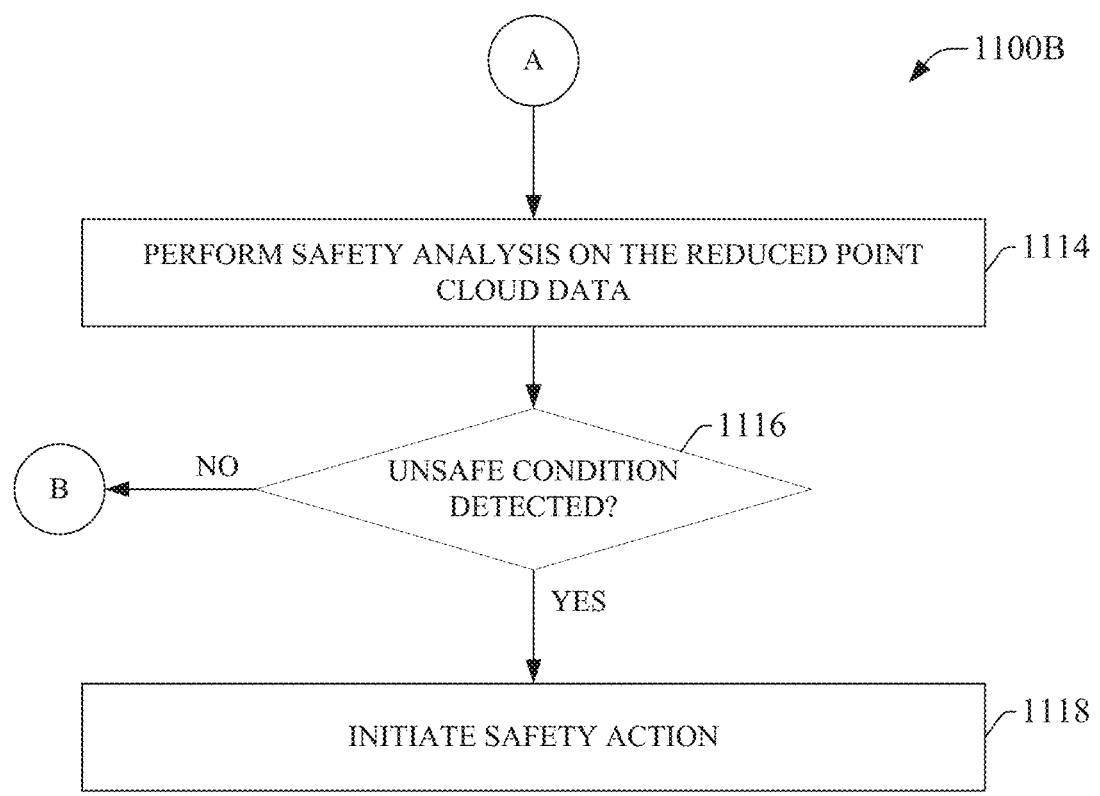
FIG. 11B is a flowchart of a second part of the example methodology for performing safety monitoring of a hazardous industrial space.

FIGS. 11A-11B illustrate a methodology in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 11A is a first part of an example methodology 1100A for performing safety monitoring of a hazardous industrial space. Initially, at 1102, three-dimensional point cloud data from a time-of-flight (TOF) sensor is received. The TOF sensor monitors an area in which an industrial automation system operates, and the point cloud data represents the monitored area as an array of distance values representing distances between the TOF sensor and respective surface points within sensor's field of view. At 1104, controller data is read from an industrial controller that monitors and controls the industrial automation system being monitored. This controller data can comprise values of sensor and telemetry signals received at the controller's inputs, values of control output signals generated by the controller, and values of user-defined data tags defined on the controller.

At 1106, real-time operation of the industrial automation system is emulated based on the controller data read at step 1104 and a digital twin of the industrial automation system. The digital twin can model the industrial assets and equipment that make up the automation system, as well as the behaviors of those assets in response to control outputs from the industrial controller. Consequently, when the digital twin is fed the same control output values being sent to the physical automation system, as well as the values of the sensor and telemetry inputs received at the controller, the digital twin can emulate or shadow the current behaviors and statuses of the physical automation system.

At 1108, shadow point cloud data is generated for the industrial automation system based on the emulation performed at step 1106. The shadow point cloud data can be generated from the perspective of an imaginary TOF sensor monitoring the emulated industrial automation system from the same point of view as that of the actual TOF sensor relative to the physical automation system.

At 1110, the shadow point cloud data is subtracted from the point cloud data generated by the TOF sensor (received at step 1102) to yield reduced point cloud data. This can entail, for example, subtracting each distance value in the array of shadow point cloud data from its corresponding distance value of the measured point cloud data on a pixel-by-pixel basis. At 1112, a determination is made as to whether the reduced point cloud data obtained at step 1110 comprises non-zero values indicative of an anomalous entity within the TOF sensor's field of view. If no such anomalous entity is detected in the reduced point cloud data (NO at step 1112), the methodology returns to step 1102 and steps 1102-1112 repeat. Alternatively, if an anomalous entity is detected in the reduced point cloud data (YES at step 1112), the methodology proceeds to the second part 1100B illustrated in FIG. 11B.

At 1114, safety analysis is performed on the reduced point cloud data. This analysis can involve, for example, identifying the entity represented by the non-zero point cloud values based on its shape and/or topology, and determining whether the location or behavior of the entity constitutes a hazardous condition based on the entity's identity (e.g., human, AGV, forklift, etc.). At 1116, a determination is made, based on the safety analysis performed at step 1114, as to whether an unsafe condition is detected. If no unsafe condition is detected (NO at step 1116), the methodology returns to step 1102, and steps 1102-1116 are repeated. Alternatively, if an unsafe condition is detected (Yes at step 1116), the methodology proceeds to step 1118, where a safety action designed to mitigate injury or damage by the automation system is initiated. Example safety actions can include, but are not limited to, removal of power from hazardous industrial assets, placement of an industrial machine in a safe operating mode (e.g., stopped, slowed, etc.), emitting a warning sound or triggering a visual warning, or other such safety actions.

Embodiments, systems, and components described herein, as well as control systems and automation environments in which various aspects set forth in the subject specification can be carried out, can include computer or network components such as servers, clients, programmable logic controllers (PLCs), automation controllers, communications modules, mobile computers, on-board computers for mobile vehicles, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including Device-Net, ControlNet, safety networks, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 12:
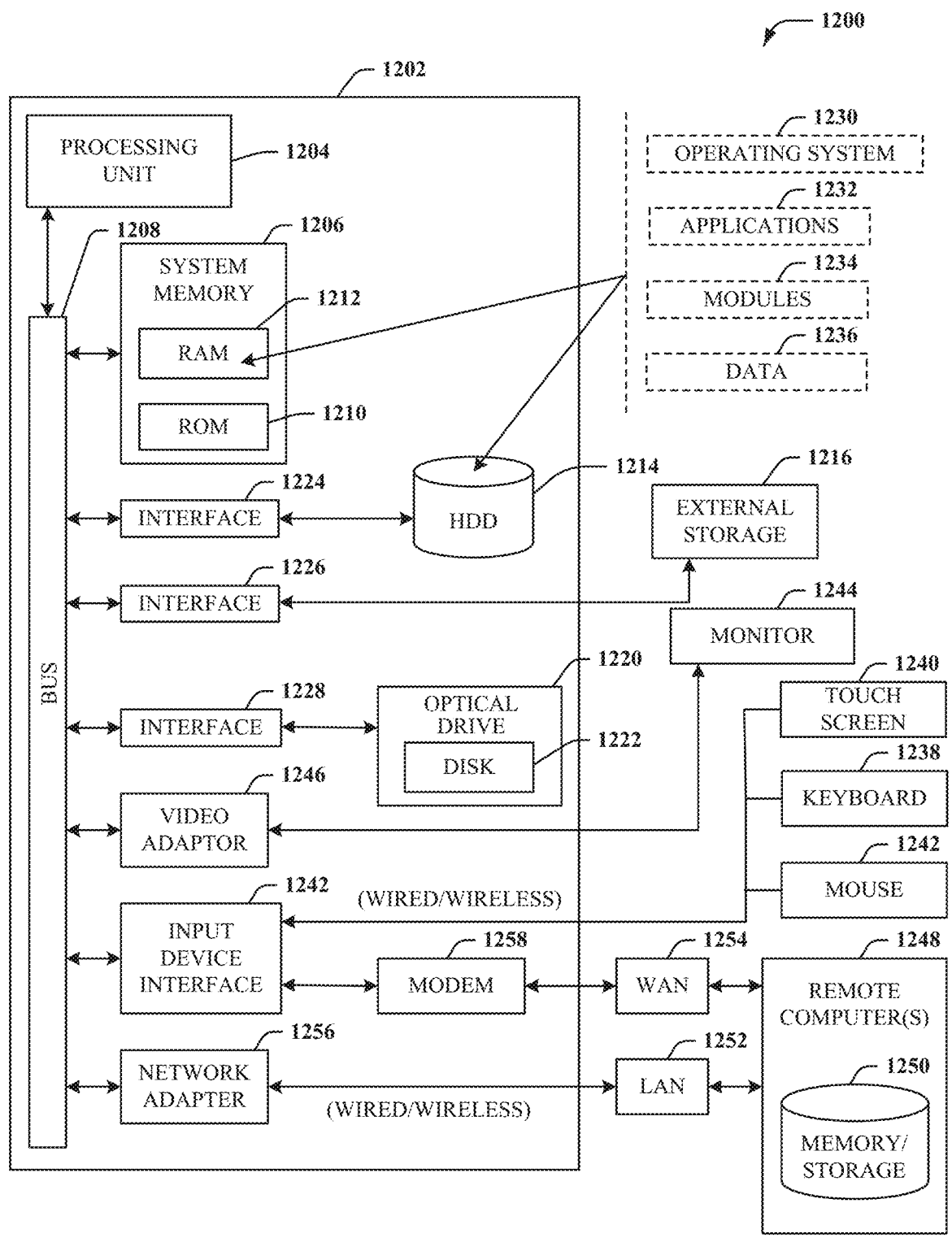
FIG. 12 is an example computing environment.
Figure 13:
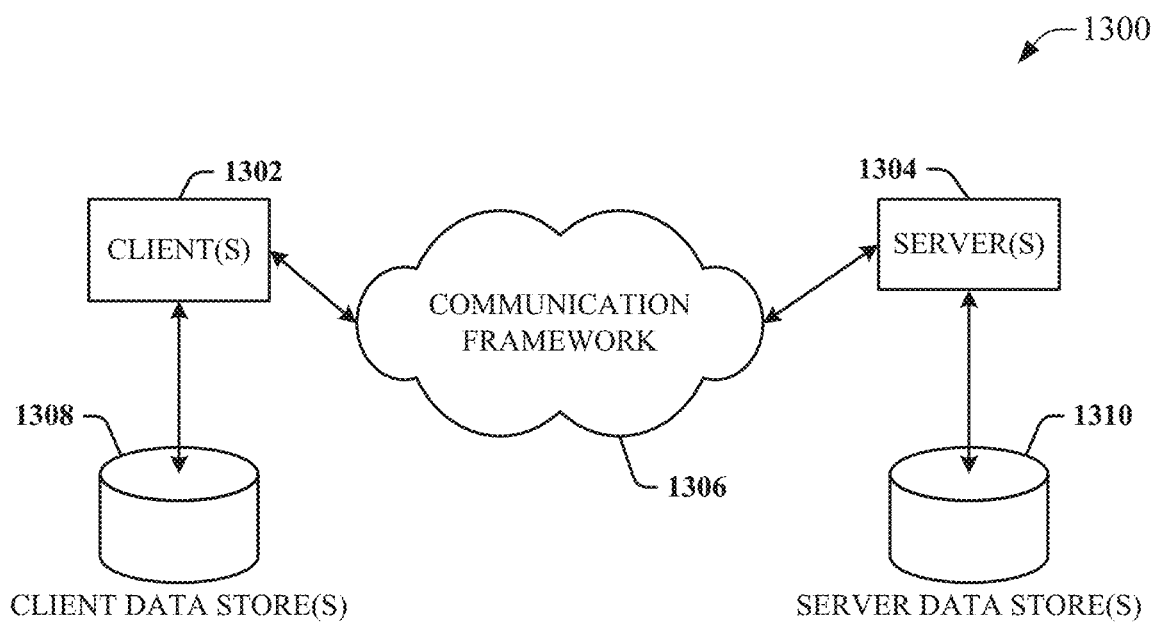
FIG. 13 is an example networking environment.

In order to provide a context for the various aspects of the disclosed subject matter, FIGS. 12 and 13 as well as the following discussion are intended to provide a brief, general description of a suitable environment in which the various aspects of the disclosed subject matter may be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 12 the example environment 1200 for implementing various embodiments of the aspects described herein includes a computer 1202, the computer 1202 including a processing unit 1204, a system memory 1206 and a system bus 1208. The system bus 1208 couples system components including, but not limited to, the system memory 1206 to the processing unit 1204. The processing unit 1204 can be any of various commercially available processors. Dual microprocessors and other multi-processor architectures can also be employed as the processing unit 1204.

The system bus 1208 can be any of several types of bus structure that can further interconnect to a memory bus (with or without a memory controller), a peripheral bus, and a local bus using any of a variety of commercially available bus architectures. The system memory 1206 includes ROM 1210 and RAM 1212. A basic input/output system (BIOS) can be stored in a non-volatile memory such as ROM, erasable programmable read only memory (EPROM), EEPROM, which BIOS contains the basic routines that help to transfer information between elements within the computer 1202, such as during startup. The RAM 1212 can also include a high-speed RAM such as static RAM for caching data.

The computer 1202 further includes an internal hard disk drive (HDD) 1214 (e.g., EIDE, SATA), one or more external storage devices 1216 (e.g., a magnetic floppy disk drive (FDD) 1216, a memory stick or flash drive reader, a memory card reader, etc.) and an optical disk drive 1220 (e.g., which can read or write from a CD-ROM disc, a DVD, a BD, etc.). While the internal HDD 1214 is illustrated as located within the computer 1202, the internal HDD 1214 can also be configured for external use in a suitable chassis (not shown). Additionally, while not shown in environment 1200, a solid state drive (SSD) could be used in addition to, or in place of, an HDD 1214. The HDD 1214, external storage device(s) 1216 and optical disk drive 1220 can be connected to the system bus 1208 by an HDD interface 1224, an external storage interface 1226 and an optical drive interface 1228, respectively. The interface 1224 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1202, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1212, including an operating system 1230, one or more application programs 1232, other program modules 1234 and program data 1236. All or portions of the operating system, applications, modules, and/or data can also be cached in the RAM 1212. The systems and methods described herein can be implemented utilizing various commercially available operating systems or combinations of operating systems.

Computer 1202 can optionally comprise emulation technologies. For example, a hypervisor (not shown) or other intermediary can emulate a hardware environment for operating system 1230, and the emulated hardware can optionally be different from the hardware illustrated in FIG. 12. In such an embodiment, operating system 1230 can comprise one virtual machine (VM) of multiple VMs hosted at computer 1202. Furthermore, operating system 1230 can provide runtime environments, such as the Java runtime environment or the .NET framework, for application programs 1232. Runtime environments are consistent execution environments that allow application programs 1232 to run on any operating system that includes the runtime environment. Similarly, operating system 1230 can support containers, and application programs 1232 can be in the form of containers, which are lightweight, standalone, executable packages of software that include, e.g., code, runtime, system tools, system libraries and settings for an application.

Further, computer 1202 can be enable with a security module, such as a trusted processing module (TPM). For instance with a TPM, boot components hash next in time boot components, and wait for a match of results to secured values, before loading a next boot component. This process can take place at any layer in the code execution stack of computer 1202, e.g., applied at the application execution level or at the operating system (OS) kernel level, thereby enabling security at any level of code execution.

A user can enter commands and information into the computer 1202 through one or more wired/wireless input devices, e.g., a keyboard 1238, a touch screen 1240, and a pointing device, such as a mouse 1242. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1204 through an input device interface 1244 that can be coupled to the system bus 1208, but can be connected by other interfaces, such as a parallel port, an IEEE 1394 serial port, a game port, a USB port, an IR interface, a BLUETOOTH® interface, etc.

A monitor 1244 or other type of display device can be also connected to the system bus 1208 via an interface, such as a video adapter 1246. In addition to the monitor 1244, a computer typically includes other peripheral output devices (not shown), such as speakers, printers, etc.

The computer 1202 can operate in a networked environment using logical connections via wired and/or wireless communications to one or more remote computers, such as a remote computer(s) 1248. The remote computer(s) 1248 can be a workstation, a server computer, a router, a personal computer, portable computer, microprocessor-based entertainment appliance, a peer device or other common network node, and typically includes many or all of the elements described relative to the computer 1202, although, for purposes of brevity, only a memory/storage device 1250 is illustrated. The logical connections depicted include wired/wireless connectivity to a local area network (LAN) 1252 and/or larger networks, e.g., a wide area network (WAN) 1254. Such LAN and WAN networking environments are commonplace in offices and companies, and facilitate enterprise-wide computer networks, such as intranets, all of which can connect to a global communications network, e.g., the Internet.

When used in a LAN networking environment, the computer 1202 can be connected to the local network 1252 through a wired and/or wireless communication network interface or adapter 1256. The adapter 1256 can facilitate wired or wireless communication to the LAN 1252, which can also include a wireless access point (AP) disposed thereon for communicating with the adapter 1256 in a wireless mode.

When used in a WAN networking environment, the computer 1202 can include a modem 1258 or can be connected to a communications server on the WAN 1254 via other means for establishing communications over the WAN 1254, such as by way of the Internet. The modem 1258, which can be internal or external and a wired or wireless device, can be connected to the system bus 1208 via the input device interface 1242. In a networked environment, program modules depicted relative to the computer 1202 or portions thereof, can be stored in the remote memory/storage device 1250. It will be appreciated that the network connections shown are example and other means of establishing a communications link between the computers can be used.

When used in either a LAN or WAN networking environment, the computer 1202 can access cloud storage systems or other network-based storage systems in addition to, or in place of, external storage devices 1216 as described above. Generally, a connection between the computer 1202 and a cloud storage system can be established over a LAN 1252 or WAN 1254 e.g., by the adapter 1256 or modem 1258, respectively. Upon connecting the computer 1202 to an associated cloud storage system, the external storage interface 1226 can, with the aid of the adapter 1256 and/or modem 1258, manage storage provided by the cloud storage system as it would other types of external storage. For instance, the external storage interface 1226 can be configured to provide access to cloud storage sources as if those sources were physically connected to the computer 1202.

The computer 1202 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

FIG. 13 is a schematic block diagram of a sample computing environment 1300 with which the disclosed subject matter can interact. The sample computing environment 1300 includes one or more client(s) 1302. The client(s) 1302 can be hardware and/or software (e.g., threads, processes, computing devices). The sample computing environment 1300 also includes one or more server(s) 1304. The server(s) 1304 can also be hardware and/or software (e.g., threads, processes, computing devices). The servers 1304 can house threads to perform transformations by employing one or more embodiments as described herein, for example. One possible communication between a client 1302 and servers 1304 can be in the form of a data packet adapted to be transmitted between two or more computer processes. The sample computing environment 1300 includes a communication framework 1306 that can be employed to facilitate communications between the client(s) 1302 and the server(s) 1304. The client(s) 1302 are operably connected to one or more client data store(s) 1308 that can be employed to store information local to the client(s) 1302. Similarly, the server(s) 1304 are operably connected to one or more server data store(s) 1310 that can be employed to store information local to the servers 1304.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A functional safety system, comprising:
a memory that stores executable components; and
a processor, operatively coupled to the memory, that executes the executable components, the executable components comprising:
 a controller interface component configured to read controller data from an industrial controller that monitors and controls an industrial automation system being monitored by a time-of-flight (TOF) sensor, the controller data comprising at least real-time values of control outputs directed to the industrial automation system;
 a digital twin execution component configured to execute an emulation that emulates a current behavior of the industrial automation system based on the controller data and a digital twin of the industrial automation system, and to generate shadow point cloud data for the industrial automation system based on execution of the emulation, the shadow point cloud data comprising an array of simulated distances between a virtualization of the industrial automation system represented by the digital twin and an imaginary TOF sensor that simulates a perspective of the TOF sensor;
 a shadow removal component configured to subtract the shadow point cloud data from measured point cloud data generated by the TOF sensor to yield reduced point cloud data; and
 a safety analysis component configured to initiate a safety action in response to determining that the reduced point cloud data indicates a hazardous condition,
 wherein the safety action is at least one of removal of power to a hazardous component of the industrial automation system, placement of the industrial automation system in a stopped mode, placement of the industrial automation system in a slow operating mode, a restriction on movement of the industrial automation system, or activation of an audible or visual warning indicator.

2. The functional safety system of claim 1, wherein
the measured point cloud data comprises an array of distance values measured by the TOF sensor, and
the shadow point cloud data simulates a result of monitoring the virtualization of the industrial automation system from the perspective of the TOF sensor.

3. The functional safety system of claim 1, wherein the emulation of the industrial automation system mirrors the current behavior of the industrial automation system.

4. The functional safety system of claim 1, wherein subtraction of the shadow point cloud data from the measured point cloud data removes first distance values corresponding to components of the industrial automation system that are modeled by the digital twin and retains second distance values corresponding to an anomalous entity that is measured by the TOF sensor and is not modeled by the digital twin.

5. The functional safety system of claim 4, wherein the safety analysis component is configured to initiate the safety action based on at least one of an identity of the anomalous entity, a location of the anomalous entity, or a speed of the anomalous entity as determined based on analysis of the reduced point cloud data.

6. The functional safety system of claim 4, wherein the safety analysis component is configured to determine a classification for the anomalous entity based on analysis of a shape of the anomalous entity as determined from the reduced point cloud data, and to initiate the safety action in response to determining that the location or the speed of the anomalous entity satisfies a condition specific to the classification.

7. The functional safety system of claim 6, wherein the classification is at least one of a human being, an automated guided vehicle, or a human-controlled vehicle.

8. The functional safety system of claim 1, the executable components further comprising a digital twin import component configured to import the digital twin into the functional safety system, wherein the digital twin is at least one of a digital model imported from a computer-aided design platform or a digitized model generated based on a digital scanning of the industrial automation system.

9. The functional safety system of claim 1, wherein the digital twin execution component is configured to generate the shadow point cloud data further based on training data specifying a position and an orientation of the TOF sensor relative to the industrial automation system.

10. A method, comprising:
reading, by a system comprising a processor, controller data from an industrial controller that monitors and controls an industrial automation system being monitored by a time-of-flight (TOF) sensor, wherein the controller data comprises at least real-time values of control outputs directed to the industrial automation system;
executing, by the system, an emulation that emulates a current operation of the industrial automation system based on the controller data and a digital twin of the industrial automation system;
generating, by the system, shadow point cloud data for the industrial automation system based on the executing of the emulation, wherein the shadow point cloud data comprises simulated pixel-wise distances between a virtualization of the industrial automation system defined by the digital twin and an imaginary TOF sensor that simulates a perspective of the TOF sensor;
subtracting, by the system, the shadow point cloud data from measured point cloud data generated by the TOF sensor to yield reduced point cloud data; and
initiating, by the system, a safety countermeasure in response to determining that the reduced point cloud data indicates a hazardous condition,
wherein the initiating of the safety countermeasure comprises at least one of disconnecting power from a hazardous machine, placing the industrial automation system in a stopped mode, placing the industrial automation system in a slow operating mode, restricting movement of the industrial automation system, or activating an audible or visual warning indicator.

11. The method of claim 10, further comprising receiving, by the system, the measured point cloud data as an array of distance values measured by the TOF sensor,
wherein the simulated pixel-wise distance values simulate a result of monitoring the virtualization of the industrial automation system from the perspective of the TOF sensor.

12. The method of claim 10, wherein the executing of the emulation of the industrial automation system comprises emulating a current state of the industrial automation system on a continuous basis.

13. The method of claim 10, wherein the subtracting comprises
removing first distance values corresponding to components of the industrial automation system that are modeled by the digital twin, and
retaining second distance values corresponding to an anomalous entity that is detected by the TOF sensor and is not modeled by the digital twin.

14. The method of claim 13, wherein the initiating of the safety countermeasure comprises initiating the safety countermeasure based on at least one of an identity of the anomalous entity, a location of the anomalous entity, or a speed of the anomalous entity as determined based on analysis of the reduced point cloud data.

15. The method of claim 13, further comprising determining, by the system, a classification for the anomalous entity based on analysis of a shape of the anomalous entity as determined from the reduced point cloud data,
wherein the initiating of the safety countermeasure comprises initiating the safety countermeasure in response to determining that a location or a speed of the anomalous entity satisfies a condition specific to the classification.

16. The method of claim 15, wherein the classification is at least one of a human being, an automated guided vehicle, or a human-controlled vehicle.

17. The method of claim 10, further comprising importing the digital twin into the system as at least one of a digital model from a computer-aided design platform or a digitized model generated based on a digital scanning of the industrial automation system.

18. The method of claim 10, wherein the generating of the shadow point cloud data comprises generating the shadow point cloud data further based on training data specifying a position and an orientation of the TOF sensor relative to the industrial automation system.

19. A non-transitory computer-readable medium having stored thereon instructions that, in response to execution, cause a system comprising a processor to perform operations, the operations comprising:
receiving controller data from an industrial controller that monitors and controls an industrial automation system that is monitored by a time-of-flight (TOF) sensor, the controller data comprising at least real-time values of control outputs directed to the industrial automation system;
executing an emulation that emulates a current behavior of the industrial automation system based on the controller data and a digital twin of the industrial automation system;
generating shadow point cloud data for the industrial automation system based on the executing of the emulation, the shadow point cloud data comprising an array of simulated distances between a virtualization of the industrial automation system represented by the digital twin and an imaginary TOF sensor that simulates a perspective of the TOF sensor;
subtracting the shadow point cloud data from measured point cloud data generated by the TOF sensor to obtain reduced point cloud data; and
initiating a safety action in response to determining that a shape defined in the reduced point cloud data satisfies a condition indicative of a hazardous condition,
wherein the initiating of the safety action comprises at least one of disconnecting power from a hazardous machine, placing the industrial automation system in a stopped mode, placing the industrial automation system in a slow operating mode, restricting movement of the industrial automation system, or activating an audible or visual warning indicator.

20. The non-transitory computer-readable medium of claim 19, wherein the subtracting comprises:
removing first distance values corresponding to elements of the industrial automation system that are modeled by the digital twin, and
retaining second distance values corresponding to an anomalous entity that is measured by the TOF sensor and is not modeled by the digital twin.

* * * * *